(12) United States Patent
Ohgami

(10) Patent No.: US 8,508,982 B2
(45) Date of Patent: Aug. 13, 2013

(54) SEMICONDUCTOR DEVICE

(75) Inventor: Takeshi Ohgami, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 114 days.

(21) Appl. No.: 13/067,193

(22) Filed: May 16, 2011

(65) Prior Publication Data

US 2011/0292717 A1    Dec. 1, 2011

(30) Foreign Application Priority Data

May 28, 2010    (JP) ................. P2010-123254

(51) Int. Cl.
*G11C 11/24*    (2006.01)

(52) U.S. Cl.
USPC ............. 365/149; 365/189.09; 365/203

(58) Field of Classification Search
USPC ................. 365/149, 189.09, 203
See application file for complete search history.

(56) References Cited

U.S. PATENT DOCUMENTS

| | | | | |
|---|---|---|---|---|
| 4,636,981 A | * | 1/1987 | Ogura | 365/189.11 |
| 5,337,272 A | * | 8/1994 | Suwa et al. | 365/149 |
| 5,973,981 A | * | 10/1999 | Lee | 365/230.01 |
| 6,021,063 A | * | 2/2000 | Tai | 365/149 |
| 6,359,817 B1 | * | 3/2002 | Casper | 365/201 |
| 7,656,720 B2 | * | 2/2010 | Ito et al. | 365/189.09 |

FOREIGN PATENT DOCUMENTS

JP    2002-134506 A    5/2002

* cited by examiner

*Primary Examiner* — Pho M Luu
(74) *Attorney, Agent, or Firm* — McGinn IP Law Group, PLLC

(57) ABSTRACT

A semiconductor device includes a first memory cell, a first line, a second line and a first capacitor. The first line is coupled to the first memory cell. The first line supplies a first voltage to the first memory cell. The second line is supplied with a fixed voltage. The first capacitor is coupled between the first and second lines.

19 Claims, 7 Drawing Sheets

US 8,508,982 B2

SEMICONDUCTOR DEVICE

BACKGROUND OF THE INVENTION

1. Field of the Invention

The present invention relates to a semiconductor device.

Priority is claimed on Japanese Patent Application No. 2010-123254, filed May 28, 2010, the content of which is incorporated herein by reference.

2. Description of the Related Art

Generally, a semiconductor device, such as a DRAM (Dynamic Random Access Memory), includes multiple memory cells each including a storage capacitor and a transistor which are coupled in series. As such a semiconductor device, Japanese Patent Laid-Open Publication No. 2002-134506 discloses a structure in which a plate voltage VPLT is equally supplied to a plate electrode that is one electrode of a storage capacitor in each memory cell.

In such a case, a transistor is coupled between a storage electrode that is the other electrode of the storage capacitor and a corresponding bit line. A gate electrode of the transistor is coupled to a word line. A plate voltage VPLT is generally set to be ½ VARY where VARY is an operational power voltage of the memory cell array.

Data 1 is defined as a state in which the storage electrode of the storage capacitor is charged to a voltage higher than the VARY (generally to VPERI that is an operational voltage of a peripheral circuit). In other words, Data 1 is defined as a state in which electric charge, the voltage value of which is greater than ½ VARY supplied to the plate electrode, is stored in the storage electrode in the positive direction.

Data 0 is defined as a state in which the storage electrode of the storage capacitor is charged to a ground voltage VSS. In other words, Data 0 is defined as a state in which electric charge, the voltage of which is ½ VARY supplied to the plate electrode, is stored in the storage electrode in the negative direction.

When reading of data from each memory cell, a predetermined memory cell is selected while the bit line is precharged to ½ VARY. In this case, when the selected memory cell stores Data 1, a voltage of the storage electrode of the storage capacitor in the selected memory cell decreases since the electric charge is transferred to the bit line. When the selected memory cell stores Date 0, on the other hand, the voltage of the storage electrode increases since the electric charge is introduced from the bit line. In contrast, a voltage of the bit line increases when the memory cell stores Data 1, and decreases when the memory cell stores Data 0. The variation in voltage of the bit line is amplified by a sense amplifier to determine whether the stored data is Data 1 or Data 0.

Regarding semiconductor devices, such as a recent DRAM, demand for higher memory capacity has been increasing, which has caused miniaturization of DRAM. Consequently, parasitic capacitance of storage electrode has been much decreased compared to that of the conventional storage electrode.

The inventor of the present invention found that a variation in voltage of the storage electrode of the storage capacitor upon reading of data is detected as a variation in voltage of the plate electrode. In other words, if the parasitic capacitance is large, the charged voltage of the parasitic capacitance is supplied to the plate electrode. Thereby, a variation in the voltage of the storage electrode has little effect on a voltage of the plate electrode. However, as the parasitic capacitance has been made small, a variation in the voltage of the storage electrode has a direct effect on a variation in the voltage of the plate electrode.

Consequently, the variation in the voltage of the plate electrode has great effect on the voltage of the storage electrode of another storage capacitor, thereby occasionally causing malfunction of the sense amplifier through the bit line.

SUMMARY

In one embodiment, a semiconductor device may include, but is not limited to: a first memory cell; a first line; a second line; and a first capacitor. The first line is coupled to the first memory cell. The first line supplies a first voltage to the first memory cell. The second line is supplied with a fixed voltage. The first capacitor is coupled between the first and second lines.

In another embodiment, a semiconductor device may include, but is not limited to: a transistor; first and second wiring lines; and first and second capacitors. The first wiring line is supplied with a first voltage. The second wiring line is supplied with a second voltage. The first capacitor may include, but is not limited to: first and second electrodes; and a first dielectric film between the first and second electrodes. The first electrode is in electrical contact with the transistor. The second electrode is in electrical contact with the first wiring line. The second capacitor may include, but is not limited to: third and fourth electrodes; and a second dielectric film between the third and fourth electrodes. The third electrode is in electrical contact with the second wiring line. The fourth electrode is in electrical contact with the first wiring line.

In another embodiment, a semiconductor device may include, but is not limited to: a plurality of first capacitors in a first region; and a second capacitor. Each of the first capacitors may include, but is not limited to: first and second electrodes; and a first dielectric film between the first and second electrodes. The second capacitor may include, but is not limited to: third and fourth electrodes; and a second dielectric film formed between the third and fourth electrodes. Each of the third and fourth electrodes surrounds the first region. The third electrode is electrically connected in common to the first electrode of each of the first capacitors. The fourth electrode is supplied with a reference voltage.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The present invention will now be described herein with reference to illustrative embodiments. The accompanying drawings explain a semiconductor device in the embodiments. The size, the thickness, and the like of each illustrated portion might be different from those of each portion of an actual semiconductor device.

Those skilled in the art will recognize that many alternative embodiments can be accomplished using the teachings of the present invention and that the present invention is not limited to the embodiments illustrated herein for explanatory purposes.

Figure 7:
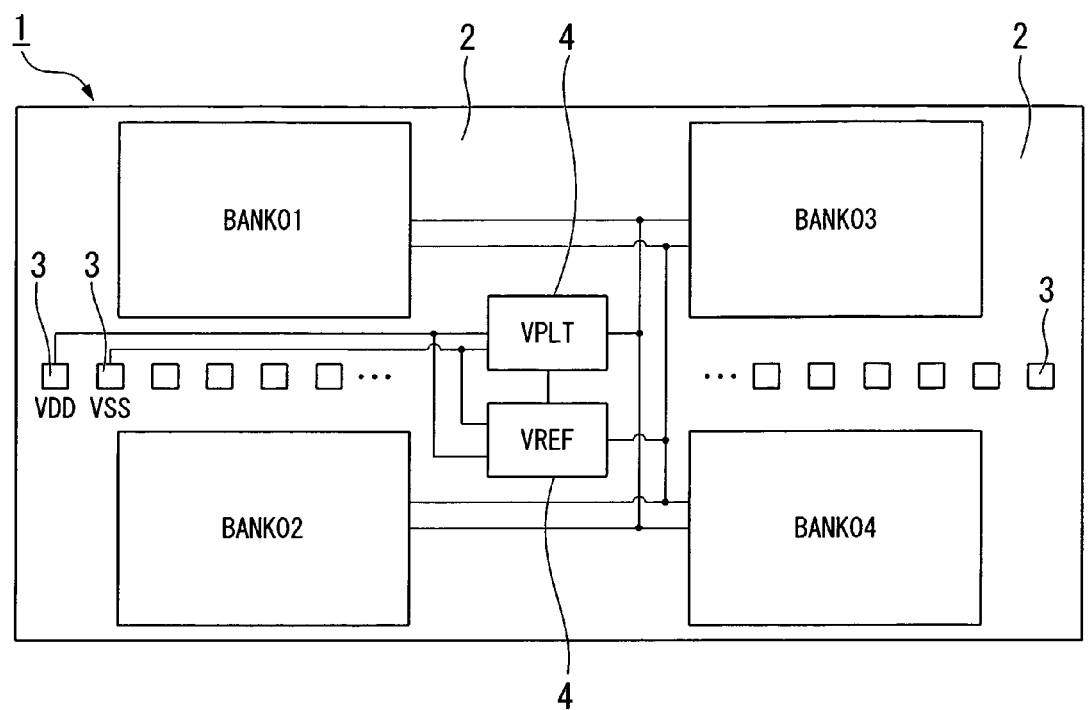
FIG. 7 is a plan view illustrating a semiconductor chip including the semiconductor device according to the first embodiment.

Hereinafter, a semiconductor chip 1 including a semiconductor device of a first embodiment of the present invention is explained. FIG. 7 is a plan view illustrating the semiconductor chip 1.

The semiconductor chip 1 includes BANK01 to BANK04, and various devices and circuits in a peripheral region 2 other than the BANK regions. Although four BANKs are provided in the case of FIG. 7, the number of the BANKs is not limited thereto. For example, eight or sixteen BANKs may be provided.

The peripheral region 2 other than the BANK regions includes multiple pads 3 and multiple circuits 4. The pads 3 include power supply pads such as a VDD pad and a VSS pad which correspond to interfaces of the semiconductor chip 1, address pads, data input/output pads, and the like. The circuits 4 supply predetermined signals and power to the BANKs. The circuits 4 include a reference voltage (VREF) generation circuit, a VPLT generation circuit, and the like.

The VPLT generation circuit outputs a VPLT voltage equally to the BANK01 to BANK04. Although the pads 3 are arranged at the center position, the positions of the pads 3 are not limited thereto, and the pads 3 may be arranged at the edge of the semiconductor chip 1.

Figure 8:
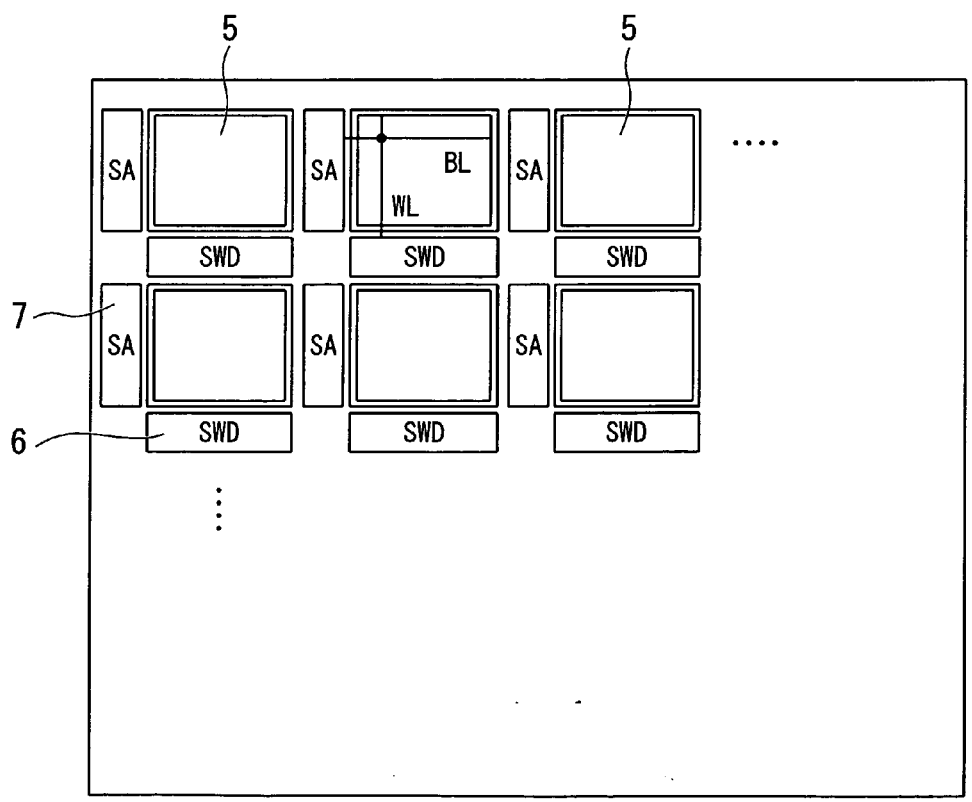
FIG. 8 is an enlarged plan view illustrating part of FIG. 7.

FIG. 8 is an enlarged plan view illustrating BANK01. BANK01 includes multiple memory cell array regions 5. Each memory cell array region 5 includes a bit line BL and a word line WL. A transistor 8 and a storage capacitor 9 are provided at an intersection of the word line WL and the bit line BL (see FIGS. 4A and 4B). The details thereof will be explained later.

Each memory cell array region 5 is provided with a sub-word driver (SWD) 6 and a sense amplifier (SA) 7. The sub-word driver (SWD) 6 drives a word line WL. The sense amplifier (SA) 7 amplifies a voltage of the bit line BL. The BANK01 to BANK04 have similar structures.

Figure 1:
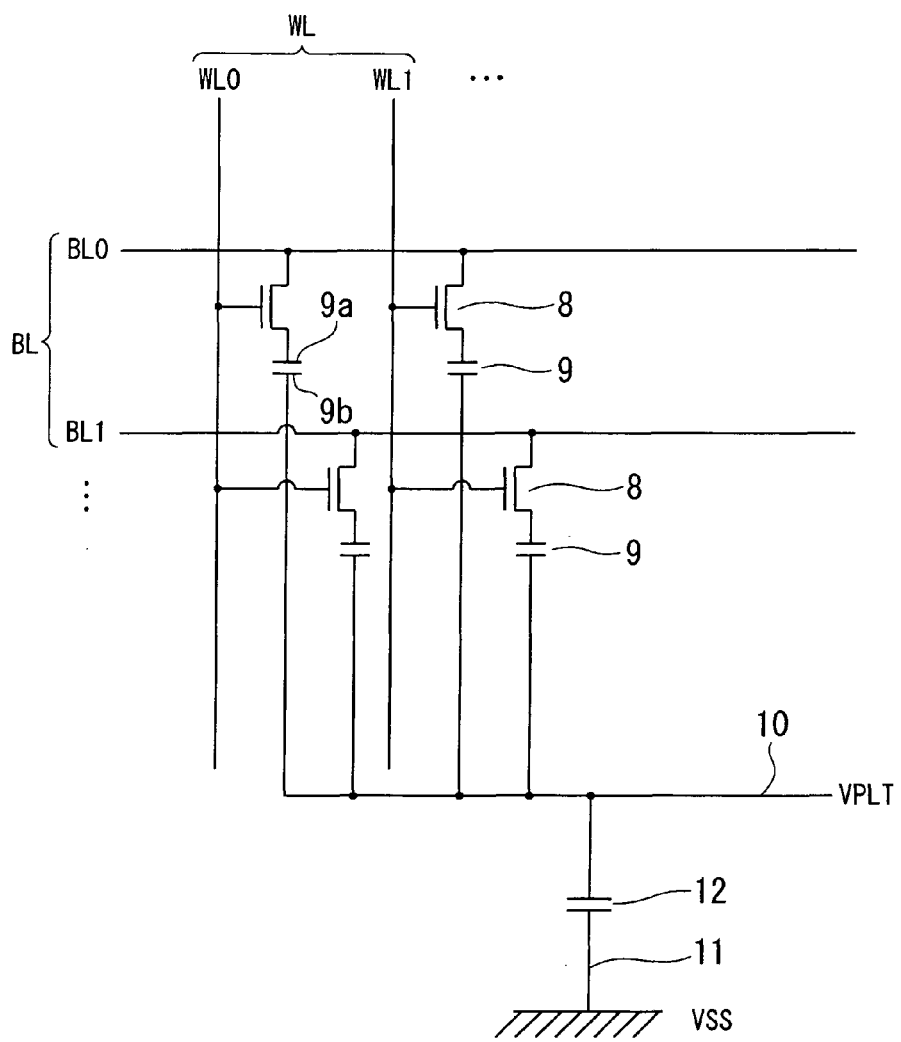
FIG. 1 is a circuit diagram illustrating a semiconductor device according to a first embodiment of the present invention.

Hereinafter, an equivalent circuit of the semiconductor device of the first embodiment is explained. FIG. 1 is a circuit diagram illustrating the semiconductor device of the first embodiment.

The semiconductor device of the first embodiment includes multiple memory cells each including the transistor 8 and the storage capacitor 9 that are coupled in series. One electrode of the storage capacitor 9 is a storage electrode 9a coupled to the transistor 8. The other electrode of the storage capacitor 9 is the plate electrode 9b coupled to a plate voltage (VPLT) supply line 10. The plate voltage (VPLT) supply line 10 is supplied with a voltage VPLT (½ VARY voltage) that is half the operational voltage VARY of the memory cell.

A power voltage (VSS) supply line 11 is supplied with a VSS that is a ground voltage. A capacitor element 12 is provided between the plate voltage supply line 10 and the power voltage (VSS) supply line 11.

When reading data, a desired word line WL is selected while the bit line BL is pre-charged to ½ VARY. In this case, multiple transistors coupled to the selected word line WL turn on. Thus, data (for example, H-level) stored in the storage capacitor 9 is transferred to the bit line Bl.

At this time, if a semiconductor device of a related art is used, a variation in the voltage of the storage electrode 9a causes a decrease in the voltage of the plate voltage supply line 10. According to the semiconductor device of the first embodiment of the present invention, however, a voltage charged in the capacitor element 12 is supplied to the plate voltage supply line 10, thereby preventing a variation in the voltage of the plate voltage supply line 10. Consequently, a determination of the data is enabled without causing malfunction of the sense amplifier (SA).

Figure 2:
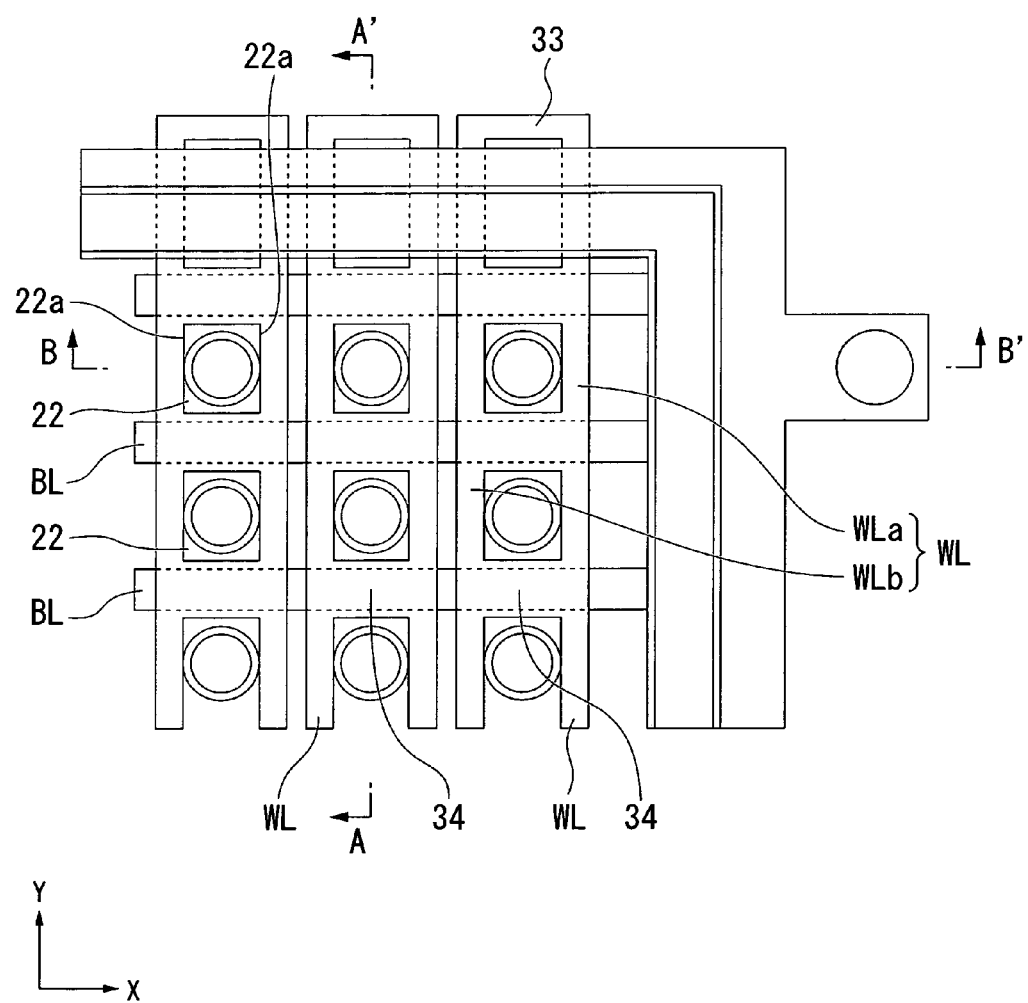
FIG. 2 is a plan view illustrating part of the semiconductor device according to the first embodiment.
Figure 4:
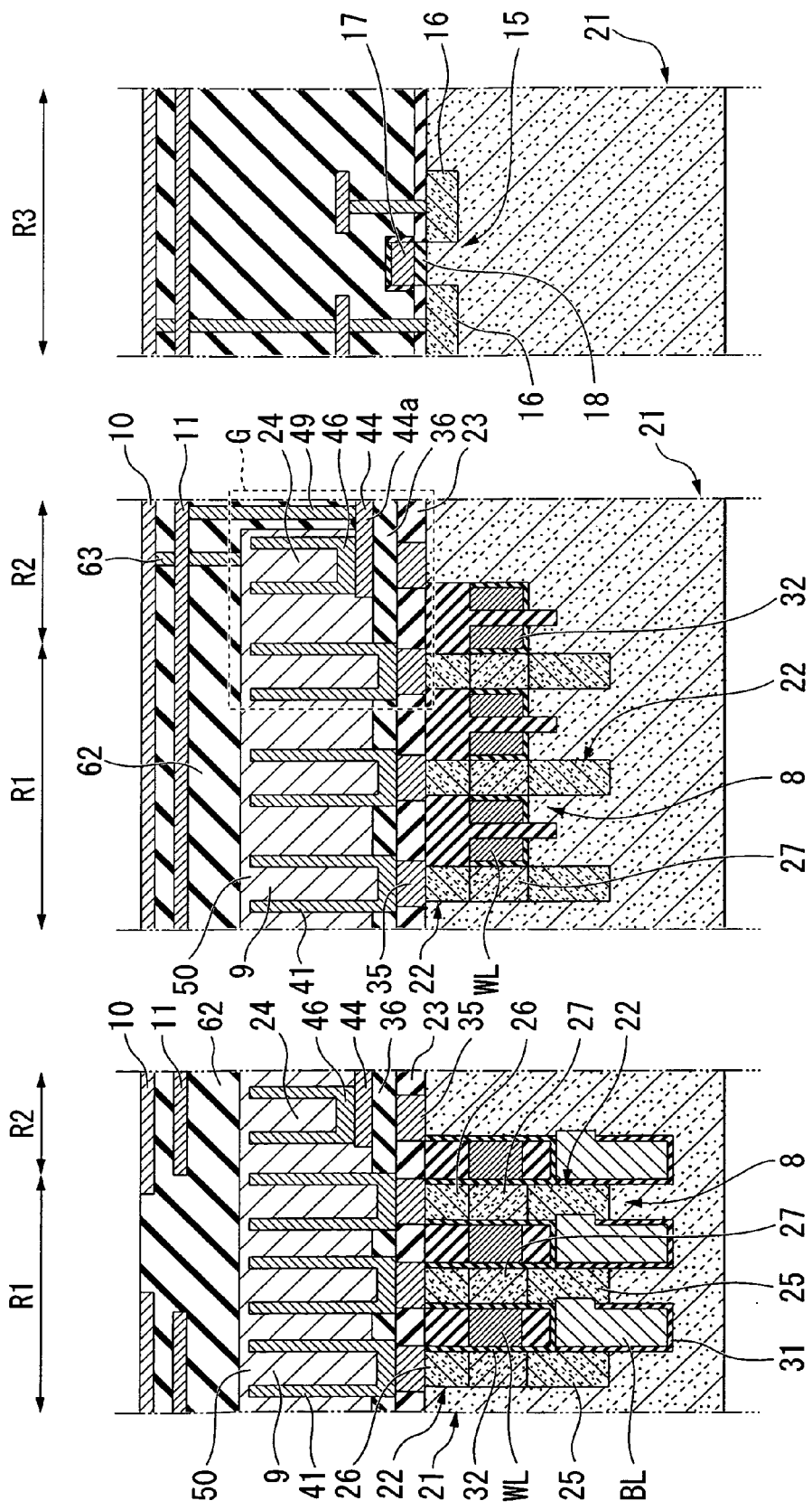
FIGS. 4A to 4C, 5, and 6 are cross-sectional views illustrating the semiconductor device according to the first embodiment.

Hereinafter, a structure of the semiconductor device of the first embodiment is explained. FIG. 2 is a plan view illustrating part of the semiconductor device of the first embodiment. FIG. 4A is a cross-sectional view taken along line A-A' shown in FIG. 2. FIG. 4B is a cross-sectional view taken along line B-B' shown in FIG. 2. FIG. 4C is a cross-sectional view illustrating the peripheral region 2.

As shown in FIGS. 4A and 4B, the semiconductor device of the first embodiment includes: a semiconductor substrate 21; a bit line BL and a word line WL which are formed in the semiconductor substrate 21; a pillar 22 that is formed by patterning the semiconductor substrate 21; an inter-layer insulating film 23 over the semiconductor substrate 21; and a storage capacitor 9 and a guard ring 24 which are formed over the inter-layer insulating film 23.

The semiconductor substrate 21 has a memory cell region R1, a peripheral region R3, and a boundary region R2 other than the memory cell region R1 and the peripheral region R3.

The bit line BL extends in an X direction shown in FIG. 2 in plan view. The word line WL extends in a Y direction shown in FIG. 2 that is perpendicular to the X direction. The bit line BL and the word line WL are formed so as to fill a bit line groove (not shown) and a word line groove (not shown) formed in the semiconductor substrate 21, respectively. The word line WL is higher in level than the bit line BL. The pillar 22 is formed in a rectangular region surrounded by the bit lines BL and the word lines WL in plan view.

A lower impurity diffusion layer 25 is formed under the pillar 22. The lower impurity diffusion layer 25 is formed by introducing an impurity into a lower portion of the semiconductor substrate 21. The lower impurity diffusion layer 25 functions as one of source and drain electrodes. An upper impurity diffusion layer 26 is formed above the semiconductor substrate 21. The upper impurity diffusion layer 26 is formed by introducing an impurity into an upper portion of the semiconductor substrate 21. The upper impurity diffusion layer 26 functions as the other one of the source and drain electrodes. A channel region 27 is formed between the upper and lower impurity diffusion layers 26 and 27.

The lower impurity diffusion layer 25 is electrically coupled to one of the bit lines BL. Specifically, two pillars 22 are formed on the both opposing sides of the bit line BL. Only one side of the bit line BL is electrically coupled to one of the two pillars 22 (the right pillar 22 in the case of FIG. 4A) via the lower impurity diffusion layer 25. The other side of the bit line BL is insulated from the other one of the two pillars 22 (the left pillar 22 in the case of FIG. 4A) by an insulating film 31.

As shown in FIG. 2, a gate insulating film 32 (see FIGS. 4A and 4B) insulates the word line WL from a side surface 22a of the pillar 22 which is perpendicular to the bit line BL in plan view.

Word lines WLa and WLb, between which the pillar 22 is positioned, extend in the Y direction. An edge portion 33 and a connection portion 34 which is formed between pillars 22 couple the word lines WLa and WLb. Thus, the word lines WLa and WLb function as one word line WL. In other words, the word lines WL are formed in a grid in plan view. Accordingly, the electric resistance of the word line WL decreases, thereby enabling stable operation of the MOS transistor.

As explained above, the transistor 8 of the first embodiment includes the lower and upper impurity diffusion layers 25 and 26 functioning as source and drain electrodes, and the word line WL functioning as a gate electrode insulated from the channel region 27 by the gate insulating film 32.

As shown in FIG. 4C, a planar transistor 15 may be formed in the peripheral region R3. The planar transistor 15 includes: a gate insulating film 18 over the semiconductor substrate 21; a gate electrode 17 over the gate insulating film 18; and an impurity diffusion layer 16 in the semiconductor substrate 21, the impurity diffusion layer 16 functioning as a source and/or drain electrode.

As shown in FIGS. 4A and 4B, an inter-layer insulating film 23 is formed over the semiconductor substrate 21. The inter-layer insulating film 23 is made of a silicon oxide film or the like. A contact plug 35 is formed over the upper impurity diffusion layer 26 so as to penetrate through the inter-layer insulating film 23. The upper impurity diffusion layer 26 is made of poly-silicon, tungsten, or the like.

An inter-layer insulating film 36 is formed over the inter-layer insulating film 23. The inter-layer insulating film 36 is made of a silicon nitride film or the like. A storage capacitor 9 is formed over the contact plug 35 in the memory cell region X so as to penetrate through the inter-layer insulating film 36.

In the first embodiment, the contact plug 35 couples the storage capacitor 9 and the upper impurity diffusion layer 26. However, the storage capacitor 9 may be provided in contact with the upper impurity diffusion layer 26.

Figure 3:
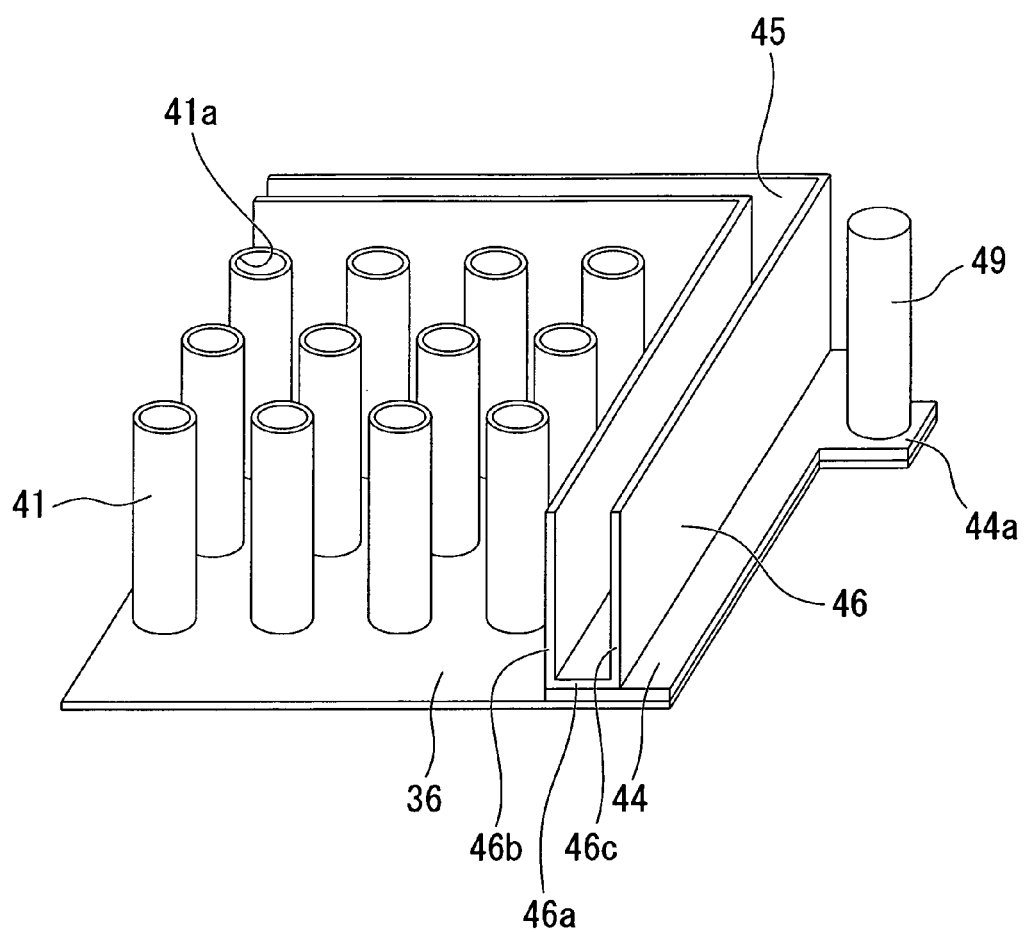
FIG. 3 is a perspective view illustrating part of the semiconductor device according to the first embodiment.
Figure 5:
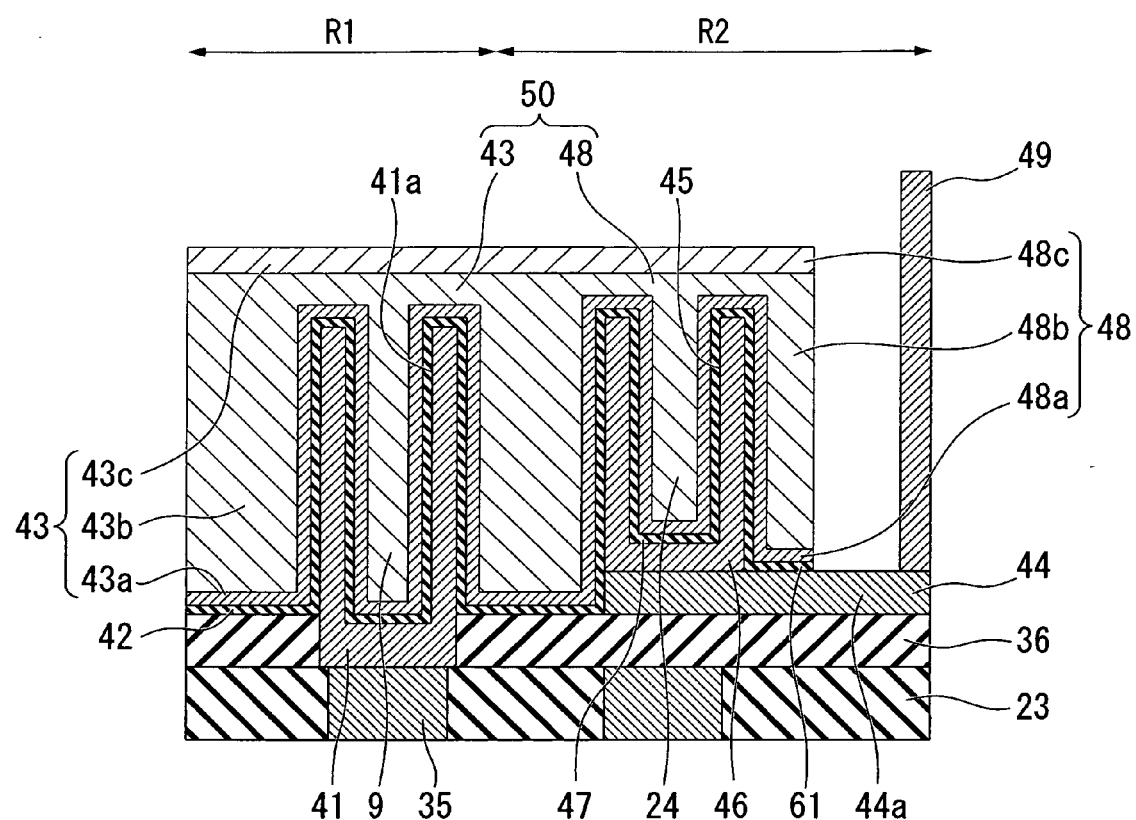

FIG. 3 is a perspective view illustrating a first lower electrode 41 included in the storage capacitor 9 and a second lower electrode 46 included in a guard ring 24. FIG. 5 is an enlarged view illustrating a portion G shown in FIG. 4B.

As shown in FIG. 5, the storage capacitor 9 includes: the first lower electrode 41 that has a bottom surface and has a cylindrical shape; a first dielectric film 42 covering the first lower electrode 41; and a first upper electrode 43 covering the first dielectric film 42. Preferably, the first lower electrode 41 has a large aspect ratio (i.e., the ratio of the height to the diameter of the cylinder), as shown in FIG. 3.

As shown in FIGS. 4A and 4B, multiple storage capacitors 9 are provided in the memory cell region R1. As shown in FIG. 5, the first dielectric film 42 and a second dielectric film 47 which will be explained later are integrated with each other. The first upper electrode 43 and a second upper electrode 48 which will be explained later are integrated with each other.

One of the storage capacitors 9, which is positioned adjacent to a guard ring 24 that will be explained later, may be a dummy capacitor. The dummy capacitor is a capacitor that does not perform writing and reading of data in a normal operation. The dummy capacitor is provided in order to properly form the shape of a capacitor that is positioned adjacent to the dummy capacitor and performs writing and reading of data in the normal operation.

As shown in FIG. 5, in the boundary region R2, a metal wiring line 44 is formed over the inter-layer insulating film 36. The metal wiring line 44 is made of tungsten or the like. The guard ring 24 is formed over the metal wiring line 44. The guard ring 24 surrounds the periphery of the memory cell region R1 in plan view. The guard ring 24 includes: the second lower electrode 46 having a groove (space) 45; the second dielectric film 47 covering the second lower electrode 46; and a second upper electrode 48 covering the second dielectric film 47.

The guard ring 24 is provided for preventing an etchant from seeping from the memory cell array region into the other region in a wet etching process for forming the first lower electrode 41, and thereby omitting an additional etching process.

As shown in FIG. 3, the groove (space) 45 of the second lower electrode 46 has a U-shape. The second lower electrode 46 has a plane portion 46a and a pair of wall portions 46b and 46c extending upward from the plane portion 46a. The groove (space) 45 and the second lower electrode 46 surround the memory cell region R1. The guard ring 24 and the storage capacitor 9 may be formed in the same process, and be made of the same material.

As shown in FIG. 5, the metal wiring line 44 under the second lower electrode 46 has an extending portion 44a that extends outward from the second lower electrode 46 in plan view. A contact plug 49 is provided so as to be coupled to the extending portion 44a. The power voltage (VSS) supply line 11 is coupled to the contact plug 49, as shown in FIGS. 4A and 4B. Consequently, the second lower electrode 46, which is coupled to the metal wiring line 44, maintains the VSS voltage.

As shown in FIG. 5, the second dielectric film 47 is provided so as to cover the second lower electrode 46 in order to separate the second lower electrode 46 from the second upper electrode 48. Similarly, an insulating film 61 is provided on the metal wiring line 44 so as to separate the metal wiring line 44 from the second upper electrode 48. The insulating film 61 and the second dielectric film 47 may be formed in the same process, and be made of the same material.

The first and second upper electrodes 43 and 48 are integrated with each other so as to cover the first and second insulating films 42 and 47, respectively. In other words, the first and second upper electrodes 43 and 48 are electrically coupled to each other. The first upper electrode 43 (second upper electrode 48) has a multi-layered structure including a titanium nitride layer 43a (48a), a poly-silicon layer 43b (48b), and a tungsten layer 43c (48c).

Specifically, the titanium nitride film 43a (48a) is formed over the first dielectric film 42 (second dielectric film 47) so as not to fully fill the space inside the first lower electrode 41 (groove (space) 45 of the second lower electrode 46). The poly-silicon layer 43b (48b) is formed over the titanium nitride layer 43a (48b) so as to fill up the space inside the first lower electrode 41 (groove (space) 45 of the second lower electrode 46). The tungsten layer 43c (48c) is formed over the poly-silicon layer 43b (48b). Thus, an upper electrode 50, which includes the first and second upper electrodes 43 and 48, is formed.

As shown in FIGS. 4A and 4B, an inter-layer insulating film 62 is provided over the upper electrode 50 including the first and second upper electrodes 43 and 48. The plate voltage supply line 10 and the power voltage supply line 11 are arranged in the inter-layer insulating film 62.

The plate voltage (VPLT) supply line 10 is coupled to the upper electrode 50 via a contact plug 63. The power voltage (VSS) supply line 11 is coupled to the second lower electrode 46 via a contact plug 49 and the metal wiring line 44. In other words, the VSS voltage is supplied from the power voltage supply line 11 to the second lower electrode 46. The VPLT voltage is supplied from the plate voltage supply line 10 to the first and second upper electrodes 43 and 48 of the upper electrode 50. Thus, the capacitor element 12 is formed between the second lower electrode (VSS voltage) 46 and the second upper electrode (VPLT voltage) 48.

In the semiconductor device having the above structure, when a word line WL is selected in a read operation, the bit line BL is coupled to the first lower electrode 41 (storage electrode 9a) via the channel region 27. Thus, data stored in the storage capacitor 9 (the first lower electrode 41) is transferred to the bit line BL through the channel region 27.

In this case, since the second lower electrode 46 is covered by the second dielectric film 47, the capacitor element 12 is formed between the second lower electrode 46 and the second upper electrode 47. In other words, the capacitor element 12 is coupled to the plate voltage supply line 10. Consequently, a variation in the voltage of the first lower electrode 41 (storage electrode 9a) is prevented from affecting the voltage of the upper electrode 50 (plate electrode 9b).

If the structure of the related art were used, a variation in the voltage of the first lower electrode 41 (storage electrode 9a) would cause a variation in the voltage of the plate voltage supply line 10 through the first upper electrode 43. On the other hand, according to the structure of the first embodiment of the present invention, the capacitor element 12 is coupled to the plate voltage supply line 10. Accordingly, even if the voltage of the first lower electrode 41 (storage electrode 9a) varies, the voltage charged in the capacitor element 12 is supplied to the plate voltage supply line 10, thereby preventing a variation in the voltage of the plate voltage supply line 10.

Therefore, a decrease in the voltage of the first lower electrode 41 (storage electrode 9a) in the read operation is likely to cause a decrease in the voltages of the storage capacitor 9 and the upper electrode 50. However, the voltage charged in the capacitor element 12 included in the guard ring 12 is supplied, thereby preventing a decrease in the voltage of the upper electrode 50 (plate electrode 9b). Consequently, malfunction of the sense amplifier can be prevented.

Second Embodiment

Figure 6:
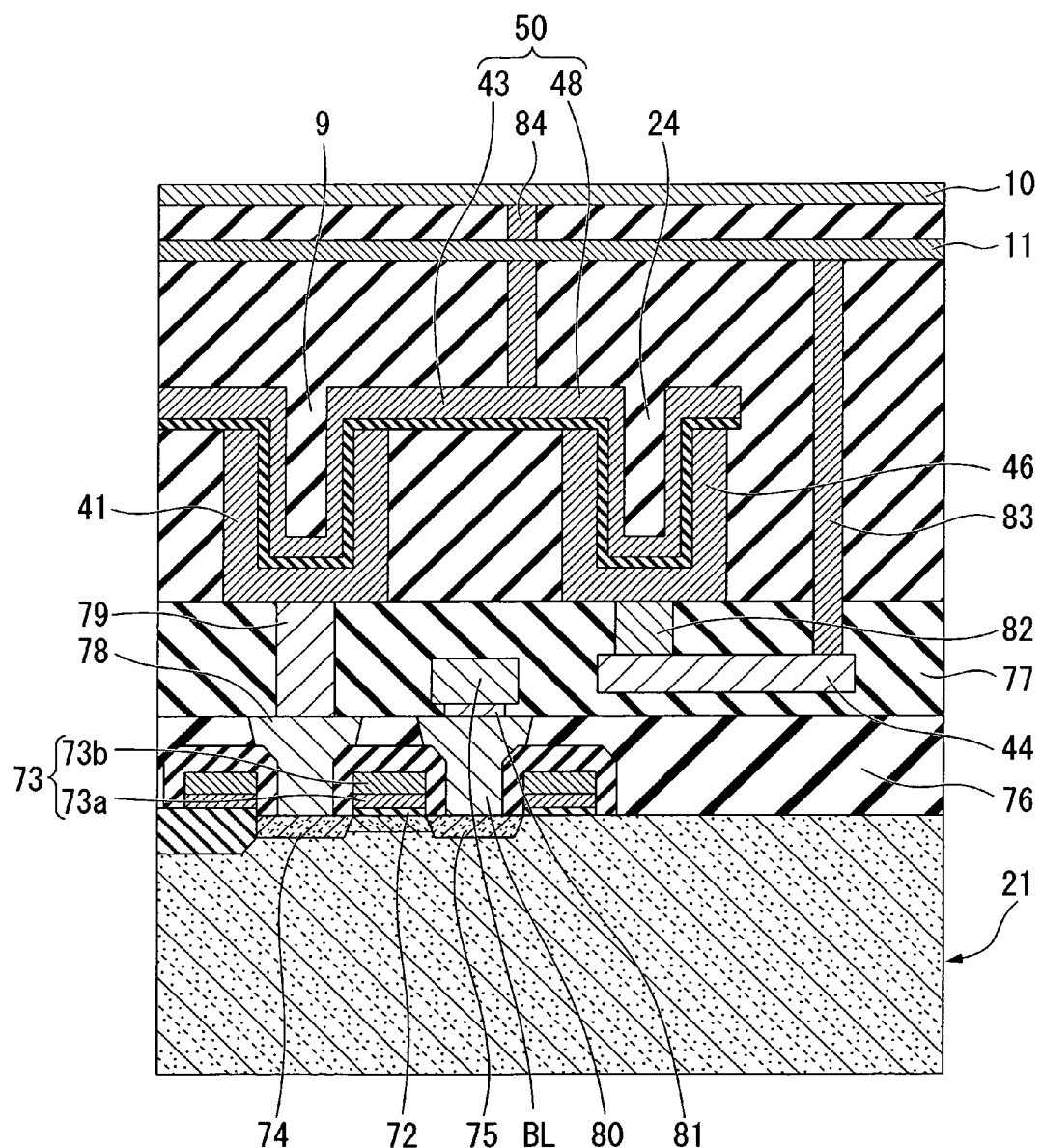

Hereinafter, a second embodiment of the present invention is explained. FIG. 6 is a cross-sectional view illustrating a semiconductor device of the second embodiment. Like reference numerals denote like elements between the first and second embodiments.

The 4F2 structure has been explained in the first embodiment. In the 4F2 structure, the word line WL and the bit line BL are buried in the semiconductor substrate 21, and the transistor 8 extends vertically from the semiconductor substrate 21. However, the 6F2 structure, in which a planar transistor is formed, may be formed as shown in FIG. 6.

In this case, for example, a planar transistor includes: a gate insulating film 72 on the semiconductor substrate 21; a gate electrode 73 on the gate insulating film 72; and a first impurity diffusion layer 74 and a second impurity diffusion layer 75 which are formed by self-alignment with respect to the gate electrode 73. The first and second impurity diffusion layers 73 and 74 are active regions of the semiconductor substrate 21.

The aforementioned capacitor and guard ring may be formed over the planar transistor. The gate electrode 73 functions as a word line WL. The gate electrode 73 may have a multi-layered structure including a poly-silicon layer 73a and a metal wiring layer 73b. An inter-layer insulating film 76 is formed over the semiconductor substrate 21 so as to cover the gate electrode 73. An inter-layer insulating film 77 is formed over the inter-layer insulating film 76.

The first and second impurity diffusion layers 74 and 75 function as source and/or drain regions. The storage capacitor 9 is coupled to one of the first and second impurity diffusion layers 74 and 75 via contact plugs 78 and 79 (to the first impurity diffusion layer 74 in the case of FIG. 6). The bit line BL is coupled to the other one of the first and second impurity diffusion layers 74 and 75 via contact plugs 80 and 81 (to the second impurity diffusion layer 75 in the case of FIG. 6). The storage capacitor 9 and the guard ring 24 are provided over the inter-layer insulating film 77, similarly to in the first embodiment.

Similar to the first embodiment, the power voltage supply line 11 is coupled to the second lower electrode 46 included in the guard ring 24, via the contact plugs 82 and 83 and the metal wiring line 44. The plate voltage supply line 10 is coupled to the upper electrode 50 via the contact plug 84. Accordingly, the capacitor element 12 is formed between the second lower electrode (VSS voltage) 46 and the upper electrode (VPLT voltage) 50. A variation in the voltage of the storage capacitor 9 is likely to cause a decrease in voltage of the upper electrode 50. However, the voltage charged in the capacitor element 12 is supplied, thereby preventing a decrease in the voltage of the upper electrode 50.

In the case of the 4F2 structure of the first embodiment shown in FIGS. 4A and 4B, the distance between the bit line BL and the upper electrode 50 is larger compared to the 6F2 structure of the second embodiment shown in FIG. 6. Accordingly, the capacitance value of the upper electrode 50 of the first embodiment is smaller than that of the second embodiment. Therefore, the present invention is more suitable to the 4F2 structure of the first embodiment than to the 6F2 structure of the second embodiment.

The inventor confirmed the following results by experiments. When a capacitance value of the upper electrode 50 was zero and a word line WL was activated, the difference voltage ΔV of the bit line was 120 mV and noises were 60 mV. After the capacitor element 12 was provided, the difference voltage ΔV was 135 mV and the noises were 6 mV. Thus, the noises were improved.

In other words, a reduction in noises achieves a sufficient different voltage ΔV, thereby enabling a reduction in a time from the activation of the word line WL to the activation of the sense amplifier. Accordingly, high-speed operation of the sense amplifier (high-speed operation of the semiconductor device) can be achieved.

As used herein, the following directional terms "forward," "rearward," "above," "downward," "vertical," "horizontal," "below," and "transverse," as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percent of the modified term if this deviation would not negate the meaning of the word it modifies.

It is apparent that the present invention is not limited to the above embodiments, and may be modified and changed without departing from the scope and spirit of the invention.

For example, the case of DRAM has been explained in the first and second embodiments, the present invention is applicable to a device other than the DRAM as long as the device includes memory cell elements.

The present invention is applicable to semiconductor device manufacturing industries.

What is claimed is:

1. A semiconductor device comprising:
   a first memory cell;
   a first line coupled to the first memory cell, the first line supplying a first voltage to the first memory cell;
   a second line supplied with a second voltage;
   a first capacitor coupled between the first and second lines;
   a word line; and
   a bit line crossing the word line and provided independently of the first line,
   wherein the first memory cell comprises
      a transistor comprising:
         a gate electrode coupled to the word line;
         a first electrode coupled to the bit line; and
         a second electrode; and
      a second capacitor coupled between the second electrode and the first line.

2. The semiconductor device according to claim 1, wherein the first capacitor includes a first pair of electrodes, the second capacitor includes a second pair of electrodes, and the first and second pairs of electrodes are made of the same material.

3. A semiconductor device comprising:
   a first memory cell;
   a first line coupled to the first memory cell, the first line supplying a first voltage to the first memory cell;
   a second line being supplied with a fixed voltage;
   a first capacitor coupled between the first and second lines; and
   a plurality of banks each comprising a plurality of memory cells that are coupled to the first line, each of the plurality of memory cells having the same structure as of the first memory cell.

4. The semiconductor device according to claim 3, wherein the first capacitor is positioned outside the plurality of memory cells, and the first capacitor surrounds the plurality of memory cells.

5. A semiconductor device comprising:
   a transistor;
   a first wiring line supplied with a first voltage;
   a second wiring line supplied with a second voltage;
   a first capacitor comprising:
      a first electrode in electrical contact with the transistor;
      a second electrode in electrical contact with the first wiring line; and
      a first dielectric film between the first and second electrodes; and
   a second capacitor comprising:
      a third electrode in electrical contact with the second wiring line;
      a fourth electrode in electrical contact with the first wiring line; and
      a second dielectric film between the third and fourth electrodes.

6. The semiconductor device according to claim 5, wherein the transistor comprises a fifth electrode adjacent to the second wiring line, the first capacitor is positioned over the fifth electrode of the transistor, the second capacitor is positioned over the second wiring line, and the first wiring line is positioned over the first and second capacitors.

7. The semiconductor device according to claim 6, further comprising:
   a third wiring line supplied with the second voltage and positioned over the first and second capacitors; and
   a contact plug connecting the second and third wiring lines to supply the second voltage to the second wiring line.

8. The semiconductor device according to claim 5, wherein the semiconductor substrate has a first region and a second region adjacent to the first region;
   the second region is free of any other transistor,
   the transistor is positioned in the first region, and
   the second capacitor is positioned over the second region.

9. The semiconductor device according to claim 5, wherein the second capacitor is larger than the first capacitor so that the second capacitor is larger in capacitance value than the first capacitor.

10. The semiconductor device according to claim 9, wherein the second voltage is lower than the first voltage.

11. The semiconductor device according to claim 5, wherein the third electrode of the second capacitor comprises:
    a plane portion; and
    a pair of wall portions protruding from the plane portion.

12. The semiconductor device according to claim 11, wherein the fourth electrode of the second capacitor fills, with an intervention of the second dielectric film, a space defined by the plane portion and the pair of wall portions of the third electrode.

13. The semiconductor device according to claim 12, wherein the second voltage is lower than the first voltage.

14. The semiconductor device according to claim 13, wherein the third electrode of the second capacitor comprises:
    a plane portion; and
    a pair of wall portions protruding from the plane portion.

15. A semiconductor device comprising:
    a plurality of first capacitors in a first region, each of the first capacitors comprising:
       a first electrode;
       a second electrode; and
       a first dielectric film between the first and second electrodes; and
    a second capacitor comprising:
       a third electrode;
       a fourth electrode; and
       a second dielectric film between the third and fourth electrodes, each of the third and fourth electrodes surrounding the first region, the third electrode being electrically connected in common to the first electrode of each of the first capacitors, and the fourth electrode being supplied with a reference voltage.

16. The semiconductor device according to claim 15, further comprising:
    a plurality of memory cell transistors in the first region, each of the memory cell transistors being electrically connected to the second electrode of an associated one of the first capacitors.

17. The semiconductor device according to claim 16, further comprising:
    a first wiring line supplying a cell plate voltage to the first electrodes of the first capacitors and the third electrode of the second capacitor; and
    a second wiring line supplying a reference voltage to the fourth electrode of the second capacitor,
    wherein each of the transistors and an associated one of the first capacitors serve as a dynamic memory cell, and the reference voltage is lower than the cell plate voltage.

18. The semiconductor device according to claim 16, wherein the reference voltage is a ground voltage.

19. The semiconductor device according to claim 18, wherein there is no any other transistor under the second capacitor.

* * * * *